United States Patent
Gui et al.

(10) Patent No.: US 9,322,894 B2
(45) Date of Patent: Apr. 26, 2016

(54) MULTIPLE EXCITATION BLADE ACQUISITION FOR MOTION CORRECTION IN MAGNETIC RESONANCE IMAGING

(75) Inventors: Dawei Gui, Sussex, WI (US); Ajeetkumar Gaddipati, Waukesha, WI (US); Xiaoli Zhao, New Berlin, WI (US); Shaorong Chang, Waukesha, WI (US); Zhiqiang Li, Tempe, AZ (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 901 days.

(21) Appl. No.: 13/568,893

(22) Filed: Aug. 7, 2012

(65) Prior Publication Data

US 2014/0043024 A1    Feb. 13, 2014

(51) Int. Cl.
G01R 33/48    (2006.01)
G01R 33/565   (2006.01)

(52) U.S. Cl.
CPC ...... *G01R 33/4824* (2013.01); *G01R 33/56509* (2013.01)

(58) Field of Classification Search
IPC .................................. G01R 33/4824,33/56509
See application file for complete search history.

(56) References Cited

U.S. PATENT DOCUMENTS

| | | | |
|---|---|---|---|
| 6,741,672 B2 | 5/2004 | Gaddipati et al. | |
| 7,023,207 B1 | 4/2006 | Gaddipati et al. | |
| 7,138,800 B1 | 11/2006 | Maier et al. | |
| 7,205,763 B2* | 4/2007 | Porter | G01R 33/56341 324/306 |
| 7,239,140 B1 | 7/2007 | Maier et al. | |
| 7,259,557 B2 | 8/2007 | Hinks et al. | |
| 7,330,028 B2 | 2/2008 | Zhao et al. | |
| 7,382,127 B2* | 6/2008 | Gaddipati | G01R 33/4824 324/307 |
| 7,420,370 B2 | 9/2008 | Hinks et al. | |
| 7,482,806 B2* | 1/2009 | Stemmer | G01R 33/4824 324/307 |
| 7,514,923 B2 | 4/2009 | Zhao | |
| 7,550,972 B1 | 6/2009 | Maier et al. | |
| 7,706,855 B1 | 4/2010 | Priatna et al. | |
| 8,131,047 B2* | 3/2012 | Li | G01R 33/4824 382/128 |
| 8,154,293 B2 | 4/2012 | Li et al. | |
| 8,384,384 B2 | 2/2013 | Zhao et al. | |
| 9,103,898 B2* | 8/2015 | Holmes | G01R 33/5602 |
| 2007/0103155 A1 | 5/2007 | Tsekos et al. | |
| 2012/0262172 A1 | 10/2012 | Holmes et al. | |

OTHER PUBLICATIONS

Hitachi Medical Systems America, Inc., Oasis Technology the Value of Motion free Imaging. www.HitachiMed.com, 2008.
Hitachi Medical Systems America, Inc., Echelon Technology the Value of Motion-free Imaging with Radar. Radar RADial Acquisition Regime. www.HitachiMed.com, 2009.

* cited by examiner

*Primary Examiner* — Dixomara Vargas
(74) *Attorney, Agent, or Firm* — Fletcher Yoder, P.C.

(57) ABSTRACT

In an embodiment, a method includes performing a magnetic resonance (MR) data acquisition sequence including the acquisition of a plurality of blades of k-space data rotated about a section of k-space. The k-space data is representative of gyromagnetic material within a subject of interest, and each blade includes a plurality of encode lines defining a width of the respective blade. The acquisition of each blade includes receiving MR signal from echoes in two or more separate echo trains to fill at least a portion of the plurality of encode lines, and the echo trains are separated by an excitation pulse.

18 Claims, 3 Drawing Sheets

US 9,322,894 B2

MULTIPLE EXCITATION BLADE ACQUISITION FOR MOTION CORRECTION IN MAGNETIC RESONANCE IMAGING

BACKGROUND OF THE INVENTION

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. During this precession, RF fields are emitted by the spinning, precessing nuclei and are detected by either the same transmitting RF coil, or by a separate coil. These signals are amplified, filtered, and digitized. The digitized signals are then processed using one or more algorithms to reconstruct a useful image.

Techniques have been developed to perform MRI imaging sequences to correct for patient motion, such as to avoid long breath holds required of patients and to correct for voluntary/involuntary patient movement. However, current techniques for such correction are often inadequate or subject to further improvement. For example, some techniques for motion correction may not enable certain types of imaging, such as T1-weighed MR imaging, to be performed. Accordingly, it is now recognized that a need exists for improved methods for data acquisition and reconstruction in magnetic resonance imaging techniques that are sensitive to patient motion.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In an embodiment, a method includes performing a magnetic resonance (MR) data acquisition sequence including the acquisition of a plurality of blades of k-space data rotated about a section of k-space. The k-space data is representative of gyromagnetic material within a subject of interest, and each blade includes a plurality of encode lines defining a width of the respective blade. The acquisition of each blade includes receiving MR signal from echoes in two or more separate echo trains to fill at least a portion of the plurality of encode lines, and the echo trains are separated by excitation pulses.

In another embodiment, a magnetic resonance imaging (MRI) system includes a primary field magnet configured to place gyromagnetic nuclei within a patient into an equilibrium magnetization; a plurality of gradient field coils configured to encode positional information into the gyromagnetic nuclei; a radiofrequency (RF) transmit coil configured to perturb the gyromagnetic nuclei away from their equilibrium magnetization; a plurality of RF receiving coils configured to receive MR signals from the gyromagnetic nuclei as they relax to their equilibrium magnetization; and control circuitry coupled to the gradient field coils, to the RF transmit coil, and to the plurality of RF receiving coils. The control circuitry is configured to apply control signals to the gradient, RF transmit or receiving coils, or any combination thereof, to acquire blades of k-space data representative of gyromagnetic material within a subject of interest, the blades being rotated about a section of k-space compared to every other blade. Each blade includes a plurality of encode lines at least partially filled by two or more echo trains acquired using two or more fast spin echo (FSE) sequences.

In a further embodiment, one or more tangible, non-transitory, machine-readable media are provided for storing instructions executable by one or more processors to: cause a magnetic resonance (MR) imaging system to acquire blades of k-space data that are rotated about a section of k-space compared to every other blade, each blade having a plurality of encode lines filled by at least two echo trains acquired during separate fast spin echo sequences; and correct the blades for motion according to a periodically rotated overlapping parallel lines with enhanced reconstruction (PROPELLER) algorithm to generate a motion-corrected image.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
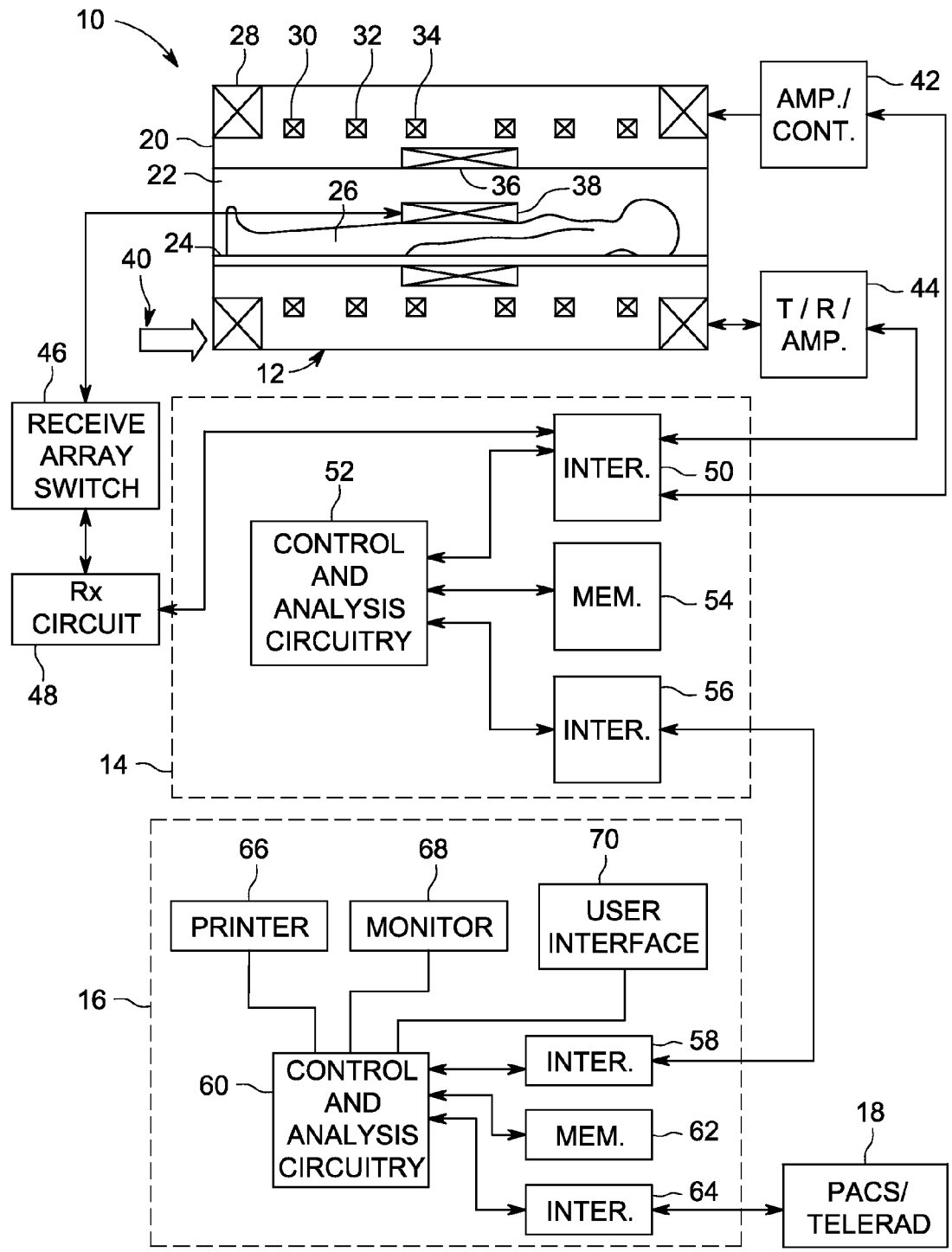
FIG. 1 is a diagrammatic illustration of an embodiment of a magnetic resonance imaging system configured to perform the data acquisition and image reconstruction described herein.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As noted above, it can be difficult to obtain clinically useful images using accelerated imaging techniques in situations where the patient being imaged is moving. In some situations, techniques for motion correction may utilize large areas of k-space acquired within a single repetition time (TR), the time between excitations during which data is acquired, using a non-Cartesian acquisition. The areas of k-space acquired in separate TR's may be combined to generate a single image after performing a motion-correction algorithm. One such technique is Periodically Rotated Overlapping Parallel Lines with Enhanced Reconstruction (PROPELLER), in which blades of k-space are each acquired in a separate TR, with each blade being rotated about the center of k-space compared to other acquired blades. In other words, a single excitation, followed by the acquisition sequence, is used to obtain each blade. All or a portion of each blade (e.g., portions in the center of k-space) may be reconstructed into a low-resolution image, and the images may be compared to determine a relative amount of motion between the images. The k-space data of each blade is then corrected for the motion, and the blades are combined to produce a fully acquired data set, which is reconstructed to produce a motion-corrected image.

In a typical scenario for the acquisition of the blades, a single excitation is used to excite nuclei within a subject of interest. After this excitation, a series of echoes are acquired, and each echo fills a line of k-space within each blade. The blades may have a minimum width, as measured by the number of lines of k-space acquired, suitable for the PROPELLER technique to provide an acceptable level of motion correction. This width is typically at least 13 phase encode lines. However, wider blades (e.g., more than 13, such as 16, 20, or more) may be desirable to enable robust motion correction.

When spin or gradient echo sequences are used to fill the blades, each echo collected fills one line in a blade. Thus, many echoes may be needed to fill a wide blade, which results in longer TR's. Because the echoes are collected sequentially after the initial excitation (e.g., 90° pulse), the longer TR's used to fill the wide blades typically result in the acquisition of T2-weighed data. Accordingly, it may be appreciated that short TR's may not necessarily be suitable for filling wide blades. Therefore, blades acquired according to a PROPELLER technique may not be suitable for providing sufficient T1-weighting contrasts, which is typically acquired using short TR's, to produce a T1-weighted image.

For example, in a fast spin echo (FSE) sequence, the number of echoes that may be acquired during a single TR, known as the echo train length (ETL), may be determined based on the duration of the TR for each blade, and also based on the nature of the data collected during the FSE sequence. In embodiments where T1-weighting is desired, a relatively short ETL may be chosen, such as less than 13, due at least partially to the short echo time (TE) used to obtain T1-weighted data. In addition, other techniques involving the attenuation of signals may limit the duration of time during each TR in which desired data may be collected from echoes. For example, during a T1-weighted fluid-attenuated inversion recovery (FLAIR) sequence, the time during which useful echoes are collected may be limited based on the inversion time (TI) of the attenuated material (e.g., cerebrospinal fluid (CSF), water). Accordingly, it is now recognized that for certain techniques such as T1 FLAIR, the ETL may be relatively short compared to an ETL that would typically be desirable for robust motion correction using the PROPELLER technique.

The present embodiments address these and other shortcomings of typical approaches by providing a system and method for performing motion correction in MR imaging using multiple excitations (i.e., multiple "shots") to fill each blade of k-space. For example, in accordance with present embodiments, each blade may be acquired using two or more excitations. As defined herein, an "excitation" is intended to denote the application of a pulse configured to tip at least a portion of the longitudinal magnetization of certain gyromagnetic nuclei (e.g., protons within an anatomy of interest) to transverse magnetization. Thus, an excitation pulse, in accordance with the present disclosure, may include any tipping pulses (e.g., 90° tipping pulses) that tip longitudinal magnetization to transverse magnetization, but may not include rephasing pulses and inversion pulses (e.g., 180° rephrasing and inversion pulses), which may not necessarily convert longitudinal magnetization into transverse magnetization.

In certain embodiments, the present approaches may enable the acquisition of wide blades (e.g., 16 or more phase encode lines) that are filled with T1-weighted MR data. For example, as noted above, it may be desirable to acquire MR data using a relatively short TR and relatively short TE such that the data acquired in each and every echo in an echo train has T1 weighting sufficient to produce a true T1-weighted image (i.e., sufficient contrast between fat and water). The present embodiments enable such data acquisition by acquiring each blade with a plurality of excitations, with the ETL being limited to no more than a predetermined number of echoes. Accordingly, each TR results in the filling of the predetermined number of phase encode lines for each blade. In accordance with present embodiments, the ETL may be limited to 10 or less echoes, 9 or less echoes, 8 or less echoes, and so on. Indeed, in embodiments where enhanced T1 weighting is desired, the ETL may be limited to no more than 5, no more than 4, no more than 3, no more than 2, or no more than 1.

It will be appreciated that 10 or less echoes may not necessarily fill a sufficient number of lines in a blade to provide robust motion correction. In other words, 10 or less echoes may not necessarily produce blades with a sufficient width for motion correction using a motion correction algorithm such as PROPELLER. However, the present embodiments provide for multiple excitations to be performed, such that a first set of echoes are collected after a first excitation, which fills a first portion of a blade, followed by the collection of a second set of echoes after a second excitation, which fills a second portion of the blade, and so on, until a predetermined total number of echoes have been collected that is sufficient to fill a blade having a predetermined width (e.g., a width sufficient for motion correction). Further, it is now recognized that it may be advantageous to perform the second excitation at the second TR immediately after the first set of echoes are collected (i.e., without intentional delay and providing for unavoidable system delays) so as to limit the effect of positional differences of the subject of interest between excitations. Indeed, by limiting the ETL to no more than a certain number (e.g., no more than 4), the TR may be shortened, reducing the likelihood that sufficient motion has occurred between excitations and enabling echoes collected from multiple excitations to be combined into a single blade. An example system for performing the techniques described herein is discussed with respect to FIG. 1, with particular embodiments of the present approaches being discussed with respect to FIGS. 2-5.

As noted above, the embodiments described herein may be performed by a magnetic resonance imaging (MRI) system, wherein specific imaging routines (e.g., accelerated imaging routines for MRI sequences) are initiated by a user (e.g., a radiologist). Further, the MRI system may perform data acquisition, data construction, and image synthesis. Accordingly, referring to FIG. 1, a magnetic resonance imaging system 10 is illustrated schematically as including a scanner 12, a scanner control circuit 14, and a system control circuitry 16. According to the embodiments described herein, the MRI system 10 is generally configured to perform MR imaging, such as imaging sequences for motion correction, T1, T2, proton density (PD) weighting, fluid attenuation, perfusion, and so on. System 10 additionally includes remote access and storage systems or devices such as picture archiving and communication systems (PACS) 18, or other devices such as teleradiology equipment so that data acquired by the system 10 may be accessed on- or off-site. In this way, acquired data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient. In addition to the coils that may be local to the scanner 12, the system 10 also includes a set of receiving coils 38 (e.g., a phased array of coils) configured for placement proximal (e.g., against) the patient 26. The receiving coils 38 may have any geometry, including both enclosed and single-sided geometries. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provided for pulsing the gradient field coils 30, 32, and 34. Such a circuit may include amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46 that is capable of switching the receiving coils 38 between receiving and non-receiving modes such that the receiving coils 38 resonate with the RF signals produced by relaxing gyromagnetic nuclei from within the patient 26 while in the receiving state, and they do not resonate with RF energy from the transmitting coils (i.e., coil 36) so as to prevent undesirable operation while in the non-receiving state. Additionally, a receiving circuit 48 is provided for receiving the data detected by the receiving coils 38, and may include one or more multiplexing and/or amplification circuits.

It should be noted that while the scanner 12 and the control/amplification circuitry described above are illustrated as being coupled by a single line, that many such lines may occur in an actual instantiation. For example, separate lines may be used for control, data communication, and so on. Further, suitable hardware may be disposed along each type of line for the proper handling of the data. Indeed, various filters, digitizers, and processors may be disposed between the scanner and either or both of the scanner and system control circuitry 14, 16. By way of non-limiting example, certain of the control and analysis circuitry described in detail below, although illustrated as a single unit, includes additional hardware such as image reconstruction hardware configured to perform the motion correction and image reconstruction techniques described herein.

As illustrated, scanner control circuit 14 includes an interface circuit 50 which outputs signals for driving the gradient field coils and the RF coil and for receiving the data representative of the magnetic resonance signals produced in examination sequences. The interface circuit 50 is coupled to a control and analysis circuit 52. The control and analysis circuit 52 executes the commands for driving the circuit 42 and circuit 44 based on defined protocols selected via system control circuit 16. Control and analysis circuit 52 also serves to receive the magnetic resonance signals and performs subsequent processing before transmitting the data to system control circuit 16. Scanner control circuit 14 also includes one or more memory circuits 54, which store configuration parameters, pulse sequence descriptions, examination results, and so forth, during operation. Interface circuit 56 is coupled to the control and analysis circuit 52 for exchanging data between scanner control circuit 14 and system control circuit 16. Such data will typically include selection of specific examination sequences to be performed, configuration parameters of these sequences, and acquired data, which may be transmitted in raw or processed form from scanner control circuit 14 for subsequent processing, storage, transmission and display. Therefore, in certain embodiments, the control and analysis circuit 52, while illustrated as a single unit, may include one or more hardware devices.

System control circuit 16 includes an interface circuit 58, which receives data from the scanner control circuit 14 and transmits data and commands back to the scanner control circuit 14. The interface circuit 58 is coupled to a control and analysis circuit 60 which may include a CPU in a multi-purpose or application specific computer or workstation. Control and analysis circuit 60 is coupled to a memory circuit 62 to store programming code for operation of the MRI system 10 and to store the processed image data for later reconstruction, display and transmission. The programming code may execute one or more algorithms capable of performing, by way of example, non-Cartesian imaging sequences and processing sampled image data (e.g., blades of data, undersampled data, fluid attenuated data), which will be discussed in detail below. An additional interface circuit 64 may be provided for exchanging image data, configuration parameters, and so forth with external system components such as remote access and storage devices 18. Finally, the system control and analysis circuit 60 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control and analysis circuit 52 associated therewith produce magnetic fields and radio frequency pulses in a controlled manner to excite and encode specific gyromagnetic material within the patient 26. The scanner 12 and control and analysis circuit 52 also sense the signals emanating from such material and create an image of the material being scanned. In certain embodiments, the scan may be a scan resulting in an array of blades of k-space data that are rotated with respect to one another about a region of k-space (e.g., the center of k-space). It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed.

Specifically, aspects of the present disclosure include methods for acquiring magnetic resonance data and processing of such data to construct a motion-corrected image, including T1-weighted images, T1-weigted images with fluid attenuation, and the like. At least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the acquisitions described herein, the system 10 may simply store the acquired data for later access locally and/or remotely, for example in a memory circuit (e.g., memory 62). Thus, when accessed locally and/or remotely, the acquired data may be manipulated by one or more processors contained within an application-specific or general purpose computer. The one or more processors may access the acquired data and execute routines stored on one or more non-transitory, machine readable media collectively storing instructions for performing methods including the image processing and reconstruction methods described herein.

As noted above, the present embodiments provide methods for performing acquisitions intended to enable motion correction, such as PROPELLER acquisitions. As generally discussed above, PROPELLER acquisitions may be non-Cartesian acquisitions, where blades of k-space data are acquired and each blade is rotated about the center of k-space with respect to every other blade. Again, the present approaches include acquisitions in which the blades acquired during such a sequence are each acquired using multiple excitation pulses and, therefore, multiple echo trains. One such blade is illustrated in FIG. 2.

Figure 2:
FIG. 2 is an exploded illustration of an embodiment of a blade in k-space produced using multiple excitations, in accordance with an aspect of the present disclosure.

In particular, FIG. 2 diagrammatically illustrates an exploded view of an imaging blade 80, which includes a plurality of encode lines 82 that have been acquired across a plurality of TR's. As defined herein, an "imaging blade" is intended to denote a blade that is acquired with the intention of using that blade for producing an image. However, as discussed in detail below, not every acquired imaging blade will be used for image reconstruction, such as due to unacceptable amounts of blurring. While the present approaches provide for any number of encode lines 82 or groups of encode lines (i.e., encode groups) to be acquired and arranged in any order for a single blade (e.g., 2, 3, 4, 5 or more), the illustrated embodiment depicts the imaging blade 80 as including four encode groups, denoted as a first encode group 84, a second encode group 86, a third encode group 88, and a fourth encode group 90. Each encode group is acquired (i.e., filled) in a separate TR by collecting echoes within an echo train of a given sequence. By way of example, each encode group may be obtained using a separate FSE sequence. In other words, the imaging blade 80 is a multiple excitation, or "multi-shot" blade. In such an embodiment, the ETL of each FSE sequence determines the number of lines 82 that are filled in each encode group. The number of FSE sequences that are sequentially performed before rotating within the plane of acquisition to acquire another blade may determine the number of encode groups and, therefore, the width, of each blade. The encode group acquired after one excitation may be interleaved with one or more encode groups acquired after other excitations within one blade even though FIG. 2 shows sequential arrangement of encode groups within one blade.

In a similar manner to the imaging blades described herein, any number of echoes may be collected to fill an encode group. In a general sense, one echo fills one line of the imaging blade 80. Accordingly, each group may be filled using one, two, three, four, or more echoes. Indeed, any number of echoes per encode group is presently contemplated. As illustrated, the first, second, third, and fourth encode groups 84, 86, 88, 90 each include four encode lines, where each line corresponds to a received echo. Thus, each group has an ETL of 4, which enables the imaging blade 80 to have an effective width of 16. Again, wider blade widths are also presently contemplated, and may enable even more robust motion correction compared to thinner blade widths, such as blade widths of less than 13, inclusive. Further, it should be noted that the number of encode lines filled in each group may differ. Thus, one encode group may include four encode lines, while others include one, two, three, four, five, or more.

In accordance with present embodiments, the imaging blade 80 may be acquired by performing four separate and distinct acquisition sequences (e.g., FSE sequences). Accordingly, the present approaches enable a variety of view ordering (order in which lines are filled) schema to be employed for filling blades of k-space, rather than being limited to sequential view ordering as in the case of single excitation blade acquisition. Such view ordering schemes are discussed in further detail with respect to FIG. 3. It should also be noted that the filling of the blades by performing separate acquisitions also enables encode lines to be skipped, which may accelerate the acquisition. In such embodiments, which may effectively correspond to parallel imaging techniques, certain of the encode groups, or lines within encode groups, may be oversampled to enable calibration-based data estimation techniques to be performed.

Figure 3:
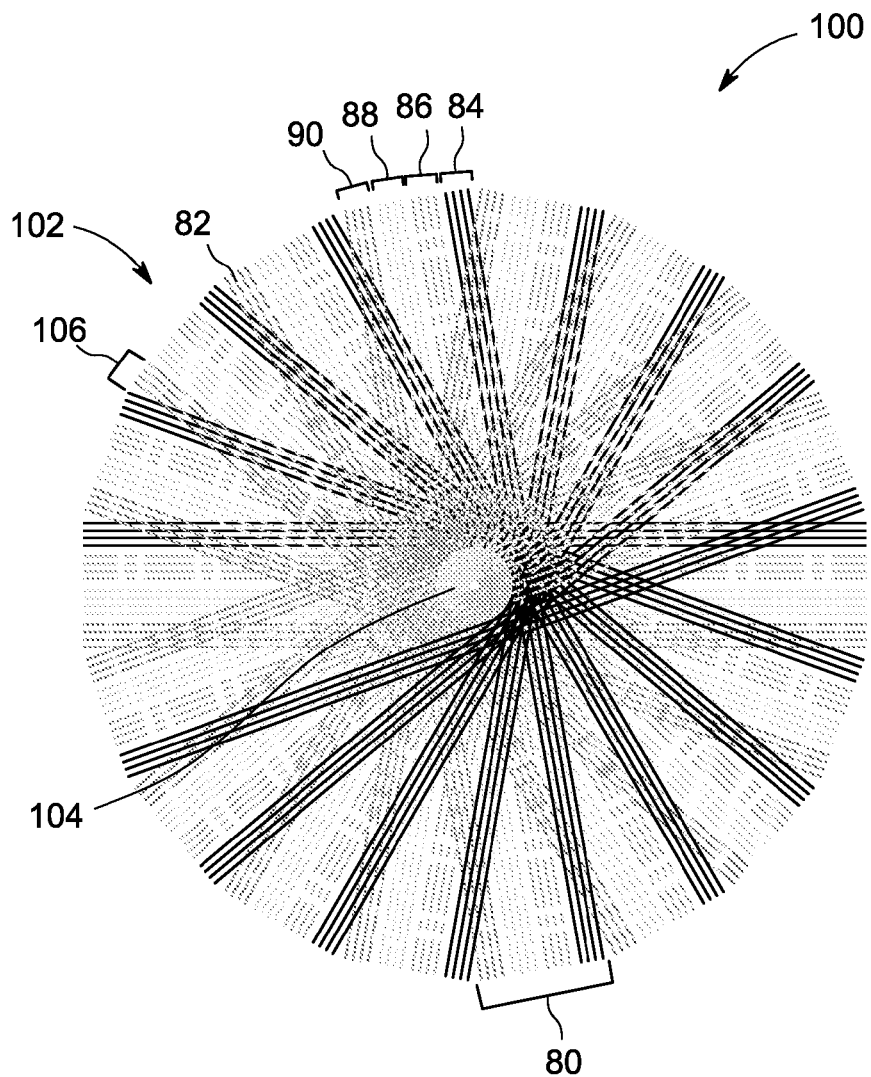
FIG. 3 is a schematic illustration of an embodiment of an acquisition trajectory in k-space including imaging blades that are each acquired using two or more excitations, in accordance with an aspect of the present disclosure.

FIG. 3 diagrammatically illustrates one acquisition trajectory 100 in accordance with present embodiments, where a series of imaging blades 102 of data in k-space are acquired using two or more separate and distinct echo trains for each blade. As illustrated, the series of blades 102 include the imaging blade 80 of FIG. 2. Indeed, as discussed with respect to FIG. 2, to produce the trajectory 100, the blades 102 (e.g., regions of k-space) having encode lines 82 are acquired by filling a pre-defined section of k-space with data to acquire the encode lines 82 of a first imaging blade or region, rotating about a section 104 (e.g., the origin) of k-space in the plane of acquisition, and acquiring subsequent imaging blades or regions 102. Each imaging blade 102 represents several TR's, unlike single excitation acquisitions, the ETL within each TR determines the number of encode lines 82 that are filled within each group 106 of the imaging blades 102.

It should be noted that while certain embodiments refer to the blades as having a rectangular geometry, the regions of k-space that are acquired in a each TR may have any geometry, such as a circular geometry, a triangular geometry, a square geometry, or any combination of geometries. Indeed, such acquisitions are also presently contemplated and are within the scope of the present disclosure. Furthermore, it should be noted that each imaging blade 102 might have the same, similar, or a different geometry when compared to other imaging blades 102.

As illustrated in FIG. 3, the imaging blades 102 are rotated about the section 104, which, due to the overlap between the imaging blades 102, fills a significant portion of k-space in the section 104 as the acquisition is performed. Thus, in certain embodiments, such filling may enable each of the imaging blades 102 to be accelerated to a certain degree. As noted above, in certain of these embodiments, the blade may also include internal calibration lines that enable or facilitate synthesis of the missing data in the non-acquired lines of each blade 102 according to parallel imaging reconstruction techniques. The calibration lines may be lines that are oversampled in the field of view (FOV) in either or both of the phase encode and frequency encode directions.

As noted above with respect to FIG. 2, the acquisition of each blade 102 using separate and distinct acquisition sequences enables flexibility in view ordering. For example, referring to the imaging blade 80 in the acquisition trajectory 100 of FIG. 3, the view ordering of blade 80 may be such that the second and third encode groups 86, 88 are filled first, followed by the first and fourth encode groups 84, 90. Such an acquisition may be desirable due to the higher relative amount of spatial information encoded in the region of k-space covered by the second and third encode groups 86, 88 compared to the first and fourth encode groups 84, 90, which may eliminate, reduce, or limit the blurring that may be caused by the combination of echoes from several TR's in each blade. However, it is also presently contemplated that the view ordering may be sequential, such that the filling of the imaging blade 80 proceeds from the first encode group 84, to the second encode group 86, to the third encode group 88, and then to the fourth encode group 90. In other embodiments, the sequential view ordering may be in the other direction, such that the fourth encode group 90 is first acquired, followed by the third encode group 88, and so on. Again, the present approaches are compatible with any view ordering scheme, and thus, may produce any type of weighting and contrast in a reconstructed image that may be desired by a user (e.g., a radiologist).

Again, as noted above with respect to the imaging blade 80 with respect to FIG. 2, each of the imaging blades 102, while illustrated as rectangles, can have any polygonal or curved geometry. Accordingly, the imaging blades 102, or the encode groups 106 used to produce the blades 102, may have a circular geometry, an ellipsoidal geometry, a triangular geometry, a square geometry, a polygonal geometry, a curved geometry, or any combination of geometries. Indeed, such acquisitions are also presently contemplated and are within the scope of the present disclosure. Further, the shape of each of the imaging blades 102 and, indeed, the shape of the groups 106 within each imaging blade 102, need not be the same shape.

Additionally or alternatively, the number of encode groups 104 and encode lines 82 may vary between imaging blades 102. For example, as noted above with respect to FIG. 2, any number of encode groups 102 is presently contemplated. However, to enable robust motion correction, the width of each imaging blade 102, as measured in encode lines 82, may be at least 15. Thus, in some embodiments, the imaging blades 102 may be acquired in a manner that enables certain imaging blades 102 to be filled with any number of encode groups 106 suitable for a particular weighting and/or level of motion correction.

Figure 4:
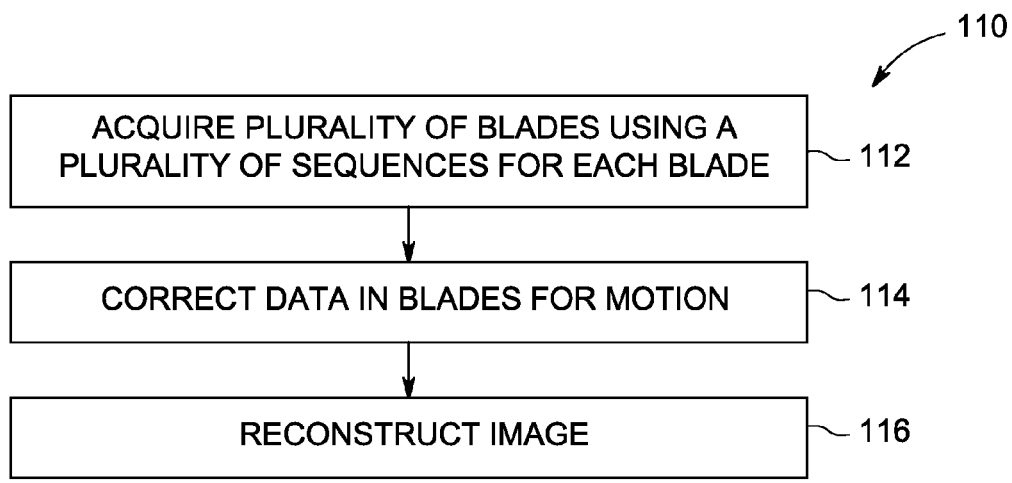
FIG. 4 is a process flow diagram illustrating an embodiment of a method for acquiring blades in k-space, each blade including data acquired from more than one excitation, motion correcting the blades, and producing an image therefrom, in accordance with an aspect of the present disclosure.
Figure 5:
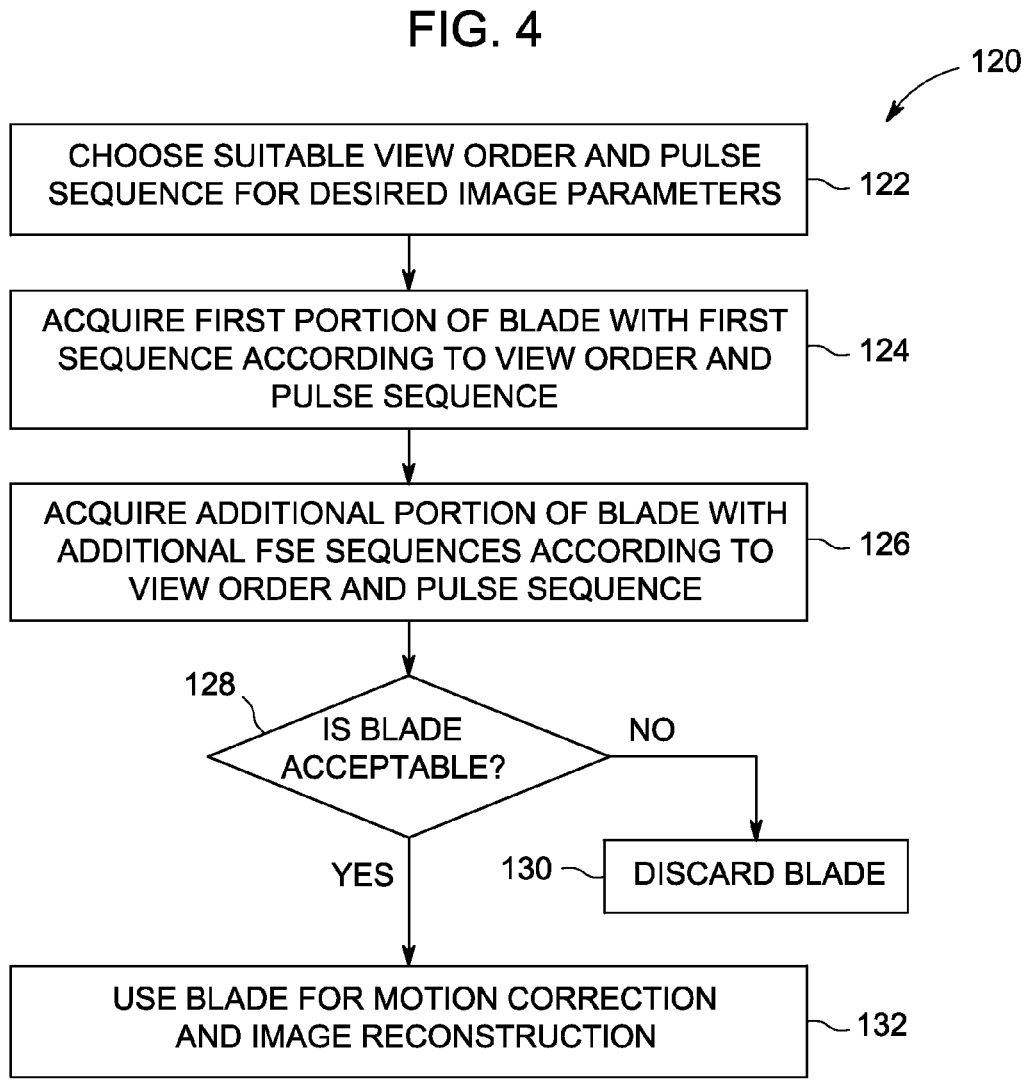
FIG. 5 is a process flow diagram illustrating an embodiment of a method for acquiring a single blade in k-space using two or more separate acquisition sequences, in accordance with an aspect of the present disclosure.

Because of the flexibility in the sequences that may be used, the imaging blades 102 may include any type of data including but not limited to T1-weighted, T1rho-weighted, proton density-weighted, T2-weighted, or T2*-weighted data. FIG. 4 is a process flow diagram illustrating an embodiment of a method 110 for producing images from such data. As noted above with respect to FIG. 1, the methods described herein with respect to FIGS. 4 and 5 may be performed, totally or partially, by the system and scanner control circuitry 14, 16 (FIG. 1), with acquisition and reconstruction being performed by either or both of the control and analysis circuitry 52, 60 local or remote to the system 10. Indeed, in certain embodiments, certain types of hardware may be dedicated for a particular purpose, such as reconstruction hardware for performing motion correction, data reconstruction (e.g., parallel imaging reconstruction), and image reconstruction.

The method 110 includes acquiring (block 112) a plurality of blades (e.g., imaging blades 102 of FIG. 3) using a plurality of acquisition sequences for each blade. Again, each acquisition sequence is started with an excitation pulse (i.e., a tipping pulse that tips longitudinal magnetization to transverse magnetization) followed by receiving one or more echoes (i.e., echoes in an echo train). While any acquisition sequence is presently contemplated, in certain embodiments, the acquisition may be an FSE sequence combined with certain techniques, such as parallel imaging, fluid attenuation, T1 weighting, T2 weighting, PD weighting, or any combination thereof. Indeed, as noted above, the present embodiments advantageously enable the collection of wide blades having T1-weighted data, even when combined with fluid attenuation techniques, which can limit the effective time during which T1-weighted data can be acquired during each TR. The manner in which each blade is collected is discussed in further detail below with respect to FIG. 5.

In addition, it should be noted that the acts according to block 112 might also include acquiring the blades in an accelerated fashion, where less than the total possible number of encodes are acquired. In such embodiments, the blades may be undersampled according to one or more parallel imaging acquisition techniques, and reconstructed according to one or more parallel imaging reconstruction techniques, such as autocalibrating techniques, externally calibrated techniques (e.g., using an external calibration blade), and so on. In other words, the present acquisition and reconstruction methods may be combined with any suitable parallel imaging acquisition and reconstruction techniques to enable fast imaging of a subject of interest.

As generally discussed above, the blades are acquired, in accordance with block 112, in a manner such that the blades are rotated in the plane of acquisition about the center of k-space (e.g., a radial or non-Cartesian acquisition) compared to each other, which enables motion correction to be performed. Accordingly, the method 110 includes correcting (block 114) the data in the imaging blades for motion. By way of non-limiting example, the motion correction may be performed according to a PROPELLER motion correction technique. In such a technique, each blade that will be used to ultimately generate an image may be compared to the other blades to correct for motion. In particular, areas of each blade proximate the center of k-space are used to generate one image for that respective blade (i.e., a low resolution image). Thus, a first blade produces a first low resolution image, a second blade produces a second low resolution image, and so on. The images produced by the blades are then compared to one another to determine a relative amount of motion between blades. The k-space data of the blades is then corrected based on this determination to produce corrected blades.

The method 110 further includes reconstructing (block 116) an image based on the corrected blades. For example, in some embodiments, the corrected blades are combined to produce a fully-sampled k-space data set. The k-space data set is then transformed (e.g., via fast Fourier Transform (FFT)) into an image.

As noted above, FIG. 5 is a process flow diagram illustrating a method 120 for acquiring each imaging blade in accordance with the present approaches. The method 120 includes choosing or determining (block 122) a view order and pulse sequence suitable for producing an image having a set of desired parameters or in a certain manner. Such parameters may include weighting, contrast, fluid attenuation, acquisition speed, dynamic imaging, and so on. In accordance with certain embodiments, each imaging blade obtained may be acquired using at least two FSE sequences, with each FSE sequence having a number of echoes collected within a certain time (i.e., each echo being collected at a particular TE) suitable for producing a desired weighting. For example, in embodiments where T1 weighting is desired, it may be desirable for the ETL of each TR to be less than a number that would result in echoes being collected beyond a time where the longitudinal relaxation of nearly all of the perturbed gyromagnetic nuclei has completed. By way of non-limiting example, the ETL may be less than 10, less than 8, less than 6, or less than 4, inclusive. However, as noted above, the present embodiments provide for the acquisition of data having any type of weighting, including T1, T2, T2*, T1-rho, photon density, and so forth.

As noted above with respect to FIGS. 2 and 3, the present embodiments enable the use of any view ordering, such as a TE-centric view ordering or a sequential view ordering. Thus, each imaging blade 102 may be filled in any order, including filling the center encode lines of each blade first, followed by filling outer portions of each blade. In other embodiments, each blade may be filled sequentially, i.e., left to right or right to left.

The method 120 then proceeds to acquiring (block 124) a first portion of a first blade using a first sequence according to the view order and pulse sequence determinations according to block 122. Thus, the acts according to block 124 may include, by way of example, performing a first FSE sequence, which may include a 90° tipping pulse, followed by a 180° rephasing pulse. An echo train may be collected after the rephasing pulse. In certain embodiments, the acquisition may be a fluid attenuated inversion recovery (FLAIR) acquisition, in which a 180° attenuating pulse may be applied before the tipping pulse. The attenuating pulse may attenuate, for example, cerebrospinal fluid (CSF), water, or similar fluids. In some embodiments, certain tissues may be attenuated.

Further, the first FSE sequence may fill a certain number of encode lines in the blade corresponding to the number of collected echoes. Again, while any number of encode lines are contemplated, in embodiments where T1 weighting is desired, the number of encode lines filled in accordance with block may be no more than 4, no more than 5, or no more than 6. Further, depending on the desired overall acquisition trajectory, the first portion may be acquired such that only a portion of lines are filled in a given section of the blade. In other words, certain encode lines may be filled while others remain unfilled. In still other embodiments, certain encode lines may be oversampled, such that the oversampled lines may serve as calibration data for parallel imaging reconstruction.

After the first portion of the blade (e.g., one of the encode groups 106) is acquired, the method 120 includes acquiring (block 126) additional portions of the same blade using different sequences. In accordance with present embodiments, the sequences may differ because the lines in k-space that are filled are different, but the types an number of pulses may be the same. In other embodiments, the additional sequences may differ entirely, with different numbers of echoes, different types of pulses, and so forth, being used.

Once the various portions of the blade have been acquired to produce the full blade (which, in certain instances, may be completely filled or may have some lines that are left unfilled), the method 120 includes determining (query 128) whether the blade is acceptable. For example, in some embodiments, the patient may be moving to a degree such that due to the different excitations performed to acquire the blade, the data includes signal acquired while the patient is in different positions. Thus, when an FFT or similar operation is performed, the resulting image may be unsuitable for use to construct the final image. Thus, while the blade may be considered to be an imaging blade, it may be discarded (block 130) when it is deemed to be unsuitable for the particular imaging sequence.

However, in embodiments where the blade is acceptable, the blade is used for motion correction and image formation (block 132). The method 120 may be repeated for each blade, with the same or different types of acquisitions being performed for each blade and/or within each blade. As noted, each blade may be rotated about a section of k-space (e.g., the center) within the plane of acquisition compared to every other blade.

It should be noted that the present approaches enable enhanced imaging when compared to single excitation (i.e., "single shot") PROPELLER techniques. For example, typical single shot PROPELLER may produce streaking in PD and T1-weighted images, and may have insufficient contrast between various tissues (e.g., bone and cartilage, bone and muscle, grey matter and white matter in the brain). Further, typical single shot PROPELLER may not enable sufficient motion correction in T1 FLAIR acquisitions, in which ETL's are limited. In contrast, the present approaches, which include multi-excitation PROPELLER, enable image formation having greatly reduced streaking, high contrast between various tissues, and also enable true T1 FLAIR acquisitions with robust motion correction by enabling the acquisition of blades having relatively large widths (e.g., 16 encode lines or more), with the encode lines having a relatively high degree of T1 weighting due to the relatively short ETL acquired after each excitation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
performing a magnetic resonance (MR) data acquisition sequence using a magnetic resonance imaging (MRI) system having primary field magnet, a plurality of gradient coils, a radiofrequency (RF) transmit coil, a plurality of RF receiving coils, and control circuitry configured to control the gradient field coils, the RF transmit coil, and the plurality of RF receiving coils, comprising:
acquiring a plurality of blades of k-space data rotated about a section of k-space, the k-space data being representative of gyromagnetic material within a subject of interest, each blade comprises a plurality of encode lines defining a width of the respective blade, and wherein the acquisition of each blade comprises:
receiving MR signal from echoes in two or more separate echo trains to fill at least a portion of the plurality of encode lines for the respective blade, wherein the echo trains are separated by an excitation pulse such that more than one excitation pulse is used to acquire each blade; and correcting, using the control circuitry, the k-space data for motion according to a Periodically Rotated Overlapping Parallel lines with Enhanced Reconstruction (PROPELLER) technique; and generating a motion corrected image from the motion corrected data.

2. The method of claim 1, wherein the echo trains consist of fast spin echo trains.

3. The method of claim 1, wherein the plurality of blades of k-space data comprise T1-weighted data, T1 rho-weighted data, proton density-weighted data, T2-weighted data, or T2*-weighted data.

4. The method of claim 1, comprising applying a fluid-attenuating inversion pulse after each excitation pulse at an inversion time (TI) and receiving the MR signal from the echoes after the fluid-attenuating inversion pulse.

5. The method of claim 1, comprising receiving no more than 4 echoes in each echo train such that no more than 4 encode lines are filled in each blade during each repetition time (TR) between excitations.

6. The method of claim 5, comprising receiving echoes from no more than 4 echo trains per blade.

7. The method of claim 1, wherein the blades of k-space data have a rectangular shape and are centered about the center of k-space.

8. The method of claim 1, comprising receiving the MR signal from the two or more echo trains such that the view ordering of each blade is not sequential.

9. The method of claim 8, wherein the view ordering is such that the center of each blade is filled before filling other regions of the blade.

10. The method of claim 1, wherein receiving the MR signal from echoes in two or more separate echo trains fills only a portion of the plurality of encode lines such that each blade comprises filled lines and unfilled lines.

11. The method of claim 10, wherein receiving the MR signal from echoes in two or more separate echo trains results in oversampling in at least some of the filled lines.

12. The method of claim 11, comprising performing parallel imaging reconstruction to fill the unfilled lines with estimated data using calibration data from the oversampled lines.

13. A magnetic resonance imaging (MRI) system, comprising:
a primary field magnet configured to place gyromagnetic nuclei within a patient into an equilibrium magnetization;
a plurality of gradient field coils configured to encode positional information into the gyromagnetic nuclei;
a radiofrequency (RF) transmit coil configured to perturb the gyromagnetic nuclei away from their equilibrium magnetization;
a plurality of RF receiving coils configured to receive MR signals from the gyromagnetic nuclei as they relax to their equilibrium magnetization; and
control circuitry coupled to the gradient field coils, to the RF transmit coil, and to the plurality of RF receiving coils, wherein the control circuitry is configured to apply control signals to the gradient, RF transmit or receiving coils, or any combination thereof, to:
acquire blades of k-space data representative of gyromagnetic material within a subject of interest, the blades being rotated about a section of k-space compared to every other blade, and wherein each blade comprises a plurality of encode lines at least partially filled by echoes from two or more echo trains acquired using two or more fast spin echo (FSE) sequences the two or more FSE sequences being separate from one another by an excitation pulse such that each blade is acquired using more than one excitation pulse; and
wherein the control circuitry is configured to store the blades of k-space data in a memory.

14. The system of claim 13, wherein the control circuitry is configured to apply control signals to the gradient, RF transmit or receive coils, or any combination thereof, such that a view ordering of the acquisition of the blades is such that the center of each blade is filled before filling other regions of the blade.

15. The system of claim 13, wherein the control circuitry is configured to apply control signals to the gradient, RF transmit or receiving coils, or any combination thereof, to apply a fluid-attenuating inversion pulse after each excitation pulse at an inversion time (TI) during the FSE sequences, and receive the MR signal from the echoes after the fluid-attenuating inversion pulse.

16. The system of claim 13, wherein the control circuitry comprises reconstruction circuitry configured to correct the blades of k-space data for motion according to a periodically rotated overlapping parallel lines with enhanced reconstruction (PROPELLER) algorithm to generate a motion-corrected image.

17. The system of claim 16, wherein the control circuitry is configured to apply control signals to the gradient, RF transmit or receiving coils, or any combination thereof, to fill only a portion of the plurality of encode lines such that each blade comprises sampled lines, oversampled lines, and unfilled lines, and wherein the reconstruction circuitry is configured to perform parallel imaging reconstruction using calibration data from at least the oversampled lines to fill the unfilled lines with estimated data.

18. One or more tangible, non-transitory, machine-readable media storing instructions executable by one or more processors to:
   cause a magnetic resonance (MR) imaging system to acquire blades of k-space data that are rotated about a section of k-space compared to every other blade, each blade comprising a plurality of encode lines filled by echoes from at least two echo trains acquired during separate fast spin echo sequences, the fast spin echo sequences being separated by an excitation pulse such that each blade of k-space data is acquired using two or more excitations;
   correct the blades of k-space data for motion according to a periodically rotated overlapping parallel lines with enhanced reconstruction (PROPELLER) algorithm, and generate a motion-corrected image from the corrected blades of k-space data.

\* \* \* \* \*